US010177052B2

(12) United States Patent
Pelley et al.

(10) Patent No.: US 10,177,052 B2
(45) Date of Patent: Jan. 8, 2019

(54) DEFECTIVE DIE REPLACEMENT IN A DIE STACK

(71) Applicant: Freescale Semiconductor, Inc., Austin, TX (US)

(72) Inventors: Perry H. Pelley, Austin, TX (US); Michael B. McShane, Austin, TX (US); Tim V. Pham, Austin, TX (US)

(73) Assignee: NXP USA, Inc., Austin, TX (US)

( * ) Notice: Subject to any disclaimer, the term of this patent is extended or adjusted under 35 U.S.C. 154(b) by 258 days.

(21) Appl. No.: 14/247,823

(22) Filed: Apr. 8, 2014

(65) Prior Publication Data

US 2015/0287653 A1    Oct. 8, 2015

(51) Int. Cl.

| H01L 23/48 | (2006.01) |
|---|---|
| H01L 23/52 | (2006.01) |
| H01L 29/40 | (2006.01) |
| H01L 21/66 | (2006.01) |
| H01L 25/065 | (2006.01) |
| H01L 25/00 | (2006.01) |
| H01L 23/00 | (2006.01) |
| H01L 25/18 | (2006.01) |

(52) U.S. Cl.
CPC .............. *H01L 22/22* (2013.01); *H01L 24/13* (2013.01); *H01L 25/0657* (2013.01); *H01L 25/18* (2013.01); *H01L 25/50* (2013.01); *H01L 24/16* (2013.01); *H01L 24/17* (2013.01); *H01L 2224/13111* (2013.01); *H01L 2224/16146* (2013.01); *H01L 2224/16225* (2013.01); *H01L 2224/17181* (2013.01); *H01L 2224/94* (2013.01); *H01L 2224/97* (2013.01); *H01L 2225/06513* (2013.01); *H01L 2225/06541* (2013.01); *H01L 2225/06565* (2013.01); *H01L 2225/06596* (2013.01); *H01L 2924/14* (2013.01); *H01L 2924/1436* (2013.01); *H01L 2924/15311* (2013.01)

(58) Field of Classification Search
CPC ..... H01L 22/22; H01L 25/50; H01L 25/0657; H01L 25/18; H01L 24/13; H01L 2224/16225; H01L 2225/06541; H01L 2924/1436; H01L 2224/16146; H01L 24/16; H01L 2225/06513; H01L 2224/94; H01L 2224/13111; H01L 2225/06596
USPC ................................. 257/777, 723, 685, 686
See application file for complete search history.

(56) References Cited

U.S. PATENT DOCUMENTS

| 7,759,800 B2 | 7/2010 | Rigg et al. |
| 7,928,590 B2 | 4/2011 | Wolter et al. |

(Continued)

OTHER PUBLICATIONS

Said Hamdioui et al., "Yield Improvement and Test Cost Optimization for 3D Stacked ICs", 2011 Asian Test Symposium, Nov. 20, 2011, 6 pages.

(Continued)

*Primary Examiner* — Kimberly Rizkallah
*Assistant Examiner* — Dilinh Nguyen

(57) ABSTRACT

The dies of a stacked die IC are tested and, in response to detection of a defect at one of the dies, the type of defect is identified. If the defect is identified as a defective module repairable at the die itself, a redundant module of the die is used to replace the functionality of the defective module. If the defect is identified as one that is not repairable, a replacement die in the die stack is used to replace the functionality of the defective die.

13 Claims, 4 Drawing Sheets

(56) References Cited

U.S. PATENT DOCUMENTS

| | | |
|---|---|---|
| 9,076,664 B2 | 7/2015 | Pelley et al. |
| 9,318,451 B2 | 4/2016 | Pham et al. |
| 9,480,161 B2 | 10/2016 | Pelley et al. |
| 2009/0085608 A1 | 4/2009 | Alzheimer |
| 2014/0055410 A1* | 2/2014 | Nakajima ............. G06F 1/3262 345/174 |
| 2014/0347943 A1* | 11/2014 | Kim .................... G11C 29/006 365/200 |

OTHER PUBLICATIONS

Joohwan Lee et al., "Yield Enhancement Techniques for 3D Memories by Redundancy Sharing Among All Layers", ETRI Journal, Jun. 2012, 11 pages.

Li Jiang et al., "Yield Enhancement for 3D-Stacked Memory by Redundancy Sharing Across Dies", 2010 IEEE/ACM International Conference on Computer Aided Design (ICCAD), 2010, 5 pages.

\* cited by examiner

DEFECTIVE DIE REPLACEMENT IN A DIE STACK

BACKGROUND

Field of the Disclosure

The present disclosure relates generally to integrated circuits and, more particularly, to integrated circuits employing a die stack.

Description of the Related Art

Traditionally, integrated circuit (IC) performance has been improved by scaling the number of components integrated into a single semiconductor die. However, because of power density constraints, limitations on interconnect scaling, and other physical limitations, it is increasingly difficult to further improve performance by scaling an individual die. Accordingly, integrated circuit designers have turned to "three-dimensional" integrated circuit arrangements, wherein multiple dies are stacked on top of each other, with interconnects (e.g., vias) providing connections between the dies. These stacked die designs provide many benefits, including small footprints, improved yields, and better performance. However, the complexity of the design and manufacture of the stacked dies increases the likelihood of defects in the integrated circuit as a whole, and such defects can be difficult and expensive to remedy.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
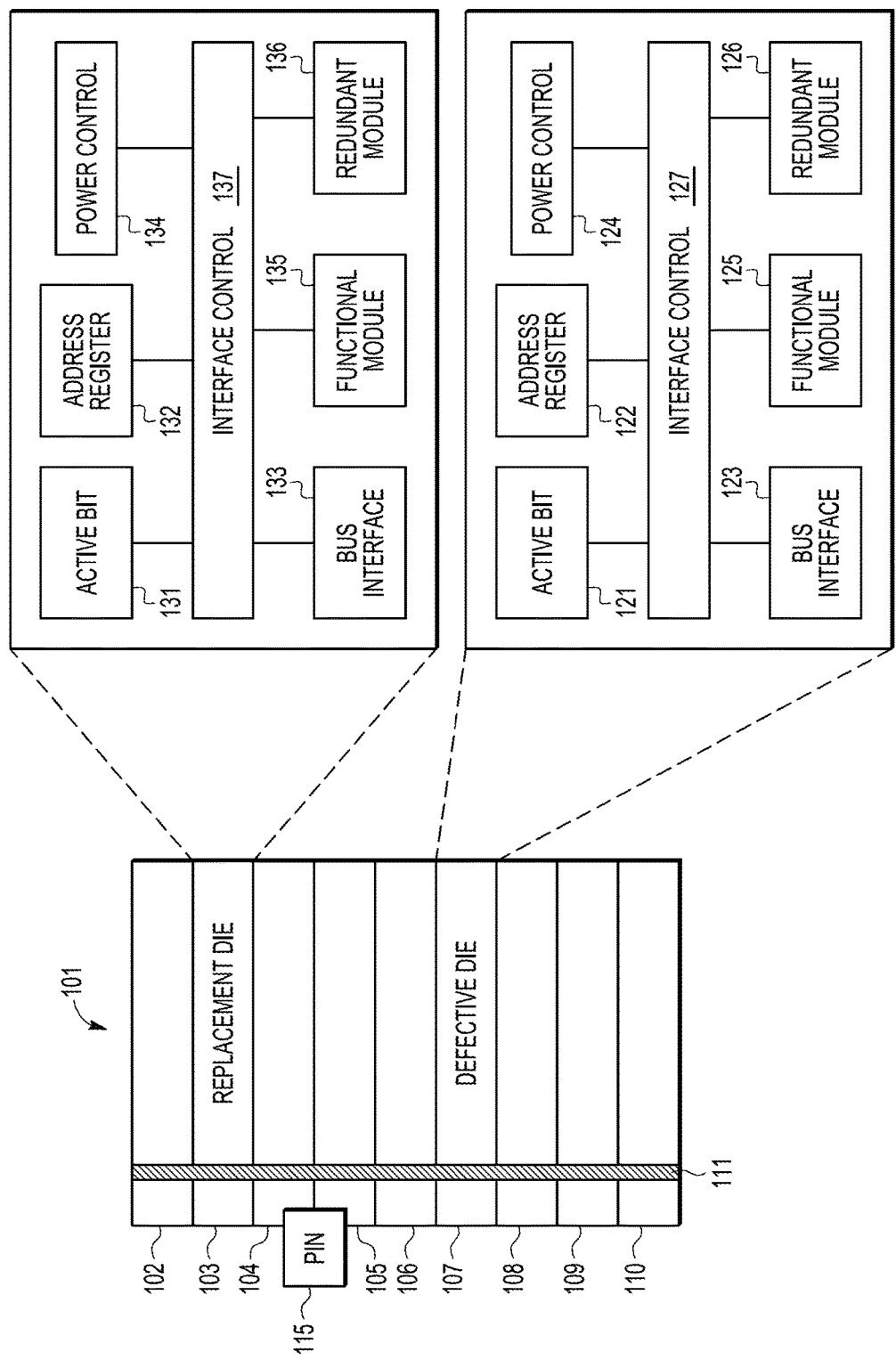
FIG. 1 is a block diagram of a stacked die IC including a replacement die in accordance with at least one embodiment of the present disclosure.

FIGS. 1-4 illustrate techniques for repairing a stacked die IC by employing a redundant die in the stack to replace a defective die. The dies of the stacked die IC are electrically tested and, in response to detection of a defect at one of the dies, the type of defect is identified. If the defect is identified as a defective module that is repairable at the die itself, a redundant module of the die is used to replace the functionality of the defective module. If the defect is identified as one that is not repairable, a replacement die in the die stack is used to replace the functionality of the defective die. Use of the replacement die reduces the number of die stacks that must be discarded due to defects, thereby reducing the cost of manufacture for the stacked die IC. In some embodiments the defective and replacement module may be a circuit block such as a processor core, a circuit, or a portion of a memory.

In at least one embodiment, the stacked die IC includes a die bus that connects the dies in the stack, with each die assigned a unique die address to be used for communication of messages over the bus. In addition, the die bus includes a control signal to indicate a repair at a die in the stack. In response to detection of a repairable defect (that is, a defect that can be remedied at the die itself), a test system asserts a signal at the control pin to indicate a repair internal to the defective die, and asserts the address of the defective die at the die bus. In addition, the test system asserts a program input at the die bus. In response, the defective die replaces at least some of the functionality of the defective module with corresponding functionality of the redundant module, thereby repairing the identified defect.

In response to detection of a non-repairable error (an error that cannot be remedied by a redundant module at the defective die itself), the test system identifies whether the die stack includes a replacement die for the defective die and, if not, adds such a replacement die to the die stack. Upon detection or addition of a redundant die at the die stack, the test system negates the signal at the control pin to indicate that an internal repair of the defective die is not taking place. In addition, the test system asserts the die address for the defective die at the die bus and also asserts a program input signal on the die bus. In response, an active bit at the defective die is negated, which in turn disables the defective die's ability to receive input data, provide output data, or receive power. The defective die is thereby deactivated. In addition, the redundant die is activated by setting an active bit for the die, causing power to be coupled to one or more modules of the redundant die. Moreover, the redundant die programs an address on the bus into address register with the die address that previously corresponded to the defective die, so that the redundant die can receive and respond to messages targeted to that die address. The redundant die thus replaces the functionality of the defective die, preserving the overall functionality of the stacked die IC. In some embodiments the active bit and the die address are stored in a nonvolatile medium such as flash memory or a set of fuses.

FIG. 1 illustrates a block diagram of a stacked die IC 100 in accordance with one embodiment of the present disclosure. The stacked die IC 100 is an integrated circuit device including a die stack 101 having dies 102-110. In the illustrated example, the die stack 101 is formed with die 110 at the bottom, die 109 stacked on die 110, die 108 stacked on die 109, die 107 stacked on die 108, and so on, with die 102 stacked on die 103 and forming the top of the stack 101. Each of the dies 102-110 is a semiconductor die including transistors and other components connected to form one or more modules that perform functions for the stacked die IC 100. In at least one embodiment, each of the dies 102-108 is formed at a different semiconductor wafer. The wafers are then aligned, bonded, and singulated into individual stacks, including the stack 101.

In one embodiment all of the die are memory die. In some embodiments all of the memory die are of the same type, for example dynamic random access memory (DRAM). In at least one embodiment, the dies 102-110 are configured to perform different functions and each of the dies 102-110 is specially designed and configured to perform its functions. For example, in at least one embodiment the modules of the die 110 form a general purpose processor, including an instruction pipeline for execution of instructions, cache memory for storage of information for the instruction pipeline, and other processor modules. The modules of the dies 102-109 are memory modules to provide system memory for the processor at the die 110. Accordingly, the dies 102-109 can include storage arrays, address decode modules, and the like, to provide memory storage functionality for the stacked die IC 100. In some embodiments more or less memory may be stacked on die 110.

The dies 102-110 can be connected via one or more interconnections (e.g. through silicon vias, or TSVs). In the illustrated example, the dies 102-110 are connected via a die bus 111 that is generally configured to communicate messages between the dies 102-108. Although for simplicity the die bus 111 is illustrated as a single bus, the die bus 111 can also represent multiple separate buses. For example, in at least one embodiment the die bus 111 represents separate address and data buses, whereby the data bus carries message data and the address bus carries corresponding message addresses indicating the destination or source of the message data.

The die 107 includes an active bit 121, an address register 122, a bus interface 123, a power control module 124, a functional module 125, and a redundant module 126. The functional module 125 is one or more circuits arranged to perform one or more specified functions, such as data storage, input/output signal control and conditioning, instruction execution, and the like. The redundant module 126 is one or more circuits that can perform some, but not all, of the functionality of the functional module 125. For example, in one embodiment the functional module 125 includes a memory array of bit cells arranged in sets of rows and columns, and the redundant module 126 is a set of bit cells sufficient to replace at least one row or column of the memory array. Accordingly, as described further herein, the redundant module 126 can be used to replace some of the functionality of the functional module 125 in response to detection of a defect at the die 107. An interface control module 127 manages the interface between active bit 121, an address register 122, a bus interface 123, a power control module 124, a functional module 125, and a redundant module 126.

The active bit 121, address register 122, bus interface 123, and power control module 124 facilitate replacement of the functionality of the functional module 125. The bus interface 123 provides an interface to send and receive messages (e.g., data with clock and control signals) via the die bus, including reception of messages indicating that the functional module 125 includes a defect in its functionality, requiring replacement by the redundant module 126. The address register 122 is a storage location that stores a die address for the die 107. As the bus interface receives messages on the bus, it compares corresponding addresses for those messages to the die address stored at the address register 122, and processes only those messages with addresses matching the die address for the die 107.

The active bit 121 is stored at a storage location such as a programmable fuse, read only memory, register, and the like, and indicates whether the die 107 is activated for the stack 101. The power control module 124 controls whether a power source (not shown), such as a voltage reference, is coupled to one, both, or neither of the functional module 125 and the redundant module 126. Thus, the power control module can include one or more power gates (switches) to selectively and individually couple or decouple power from the functional module 125 and the redundant module 126 based on received control signaling, thereby facilitating replacement of functionality for the functional module 125.

In operation, the functionality of the dies 102-110 is tested by a test system (not shown at FIG. 1) having a test probe. In some embodiments the test system can apply power to the dies 102-110 individually, and apply stimuli at one or more signal contacts of each die and measure signal characteristics at one or more other signal contacts to test the functionality of each die. The test system can measure any of a variety signal characteristics, including signal strength, persistence, timing, and the like, and compare the characteristics to a specification indicating expected results. The test system can identify a defect in response to the one or more of the measured tested signal characteristics not matching the specification. Further, the test system can, in at least some instances, classify the defect based on the measured tested signal characteristics into one or more categories. For example, the test system can classify the defect as a repairable defect, indicating that the defective die can be repaired using the functionality of a redundant module at the die, or a non-repairable defect, indicating the functionality of the die cannot be repaired through the use of a redundant module at the die.

In response to identifying a repairable error at defective die 107, the test system asserts a signal at a control pin, designated pin 115, of the IC 100, indicating a die repair is being performed. In addition, the test system applies the die address of the die 107 at the die bus 111 and asserts a program input that applies a message to the die bus 111 indicating the type of repair to be performed. The bus interface 123 receives the message with the die address, and provides the program input information to the functional module 125 and the power control module 124. In response, the power control module 124 couples the power source to the redundant module 126 to enable the module's functionality. In addition, the functional module 125 reroutes a subset of its internal signal paths to replace its defective portions with the functionality of the redundant module 126. For example, the redundant module 126 may include a set of bit cells to replace defective bit cells of the functional module 125. Accordingly, in response to the program input, the functional module 125 decouples the defective bit cells from its internal memory buses and couples the bit cells of the redundant module 126 to those same buses, thereby replacing the defective bit cells. Thus, in response to a repairable defect at the defective die 107, the functionality of the defective portions of the die 107 are replaced by the functionality of corresponding portions of the redundant module 126.

As indicated above, some types of defects are non-repairable, such that they cannot be remedied through the use of a redundant module at the defective die. Accordingly, the die stack 101 includes a replacement die 103 that can be used to replace the entire functionality of the defective die 107. Replacement die 103 may be assembled in any die location in the die stack 101 or may be added after a non-repairable die defect is detected. In the illustrated example, the design of replacement die 103 is the same as that of the die 107, and as such the replacement die 103 includes an active bit 131, an address register 132, a bus interface 133, a power control module 134, a functional module 135, and a redundant module 136 and an interface control module 137. The operations of each of these modules are substantially similar to the operations of the corresponding modules of the defective die 107. In particular, the functional module 135 includes circuits arranged to perform substantially the same functions as the functional module 125.

In operation, in response to identifying a non-repairable defect at the die 107, the test system negates a signal at the control pin 115, indicating a non-internal repair of a die. In addition, the test system applies the die address for the defective die 107 at the die bus 111, and further applies a program input to the die bus 111 indicating the type of repair being performed. In response, the bus interface 123 clears the active bit 121 of die 107, indicating die 107 is deactivated. In response to negating of the active bit 121, the power control module 124 decouples power from the functional module 125 and the redundant module 126. The functional module 125 may take additional action in response to the active bit 121 being cleared, such as clearing the bus address at the address register 122, placing input or output (input/output) portions of the module in an inactive (e.g. tristate) state to ensure they do not inadvertently receive or provide erroneous data to other dies, and the like.

In addition, in response to the de-assertion of the signal at the control pin 115 and to the program input, the active bit 131 of die 103 is set to indicate the replacement die 103 is active. In response, the power control module 134 couples power to the functional module 135 so that it is enabled to execute its functions. Further, the bus interface 133 stores the die address previously assigned to the defective die 107 at the address register 132. Accordingly, subsequent messages on the die bus 111 targeted to that die address will be processed by the bus interface 133, rather than by the bus interface 123 at the defective die 107. The replacement die 103 thus replaces the functionality of the defective die 107, allowing the die stack 101 to be incorporated in a device, rather than discarded due to the detected non-repairable defect. In some embodiments the active bit and the die address are stored in a nonvolatile medium such as flash memory or a set of fuses.

Figure 2:
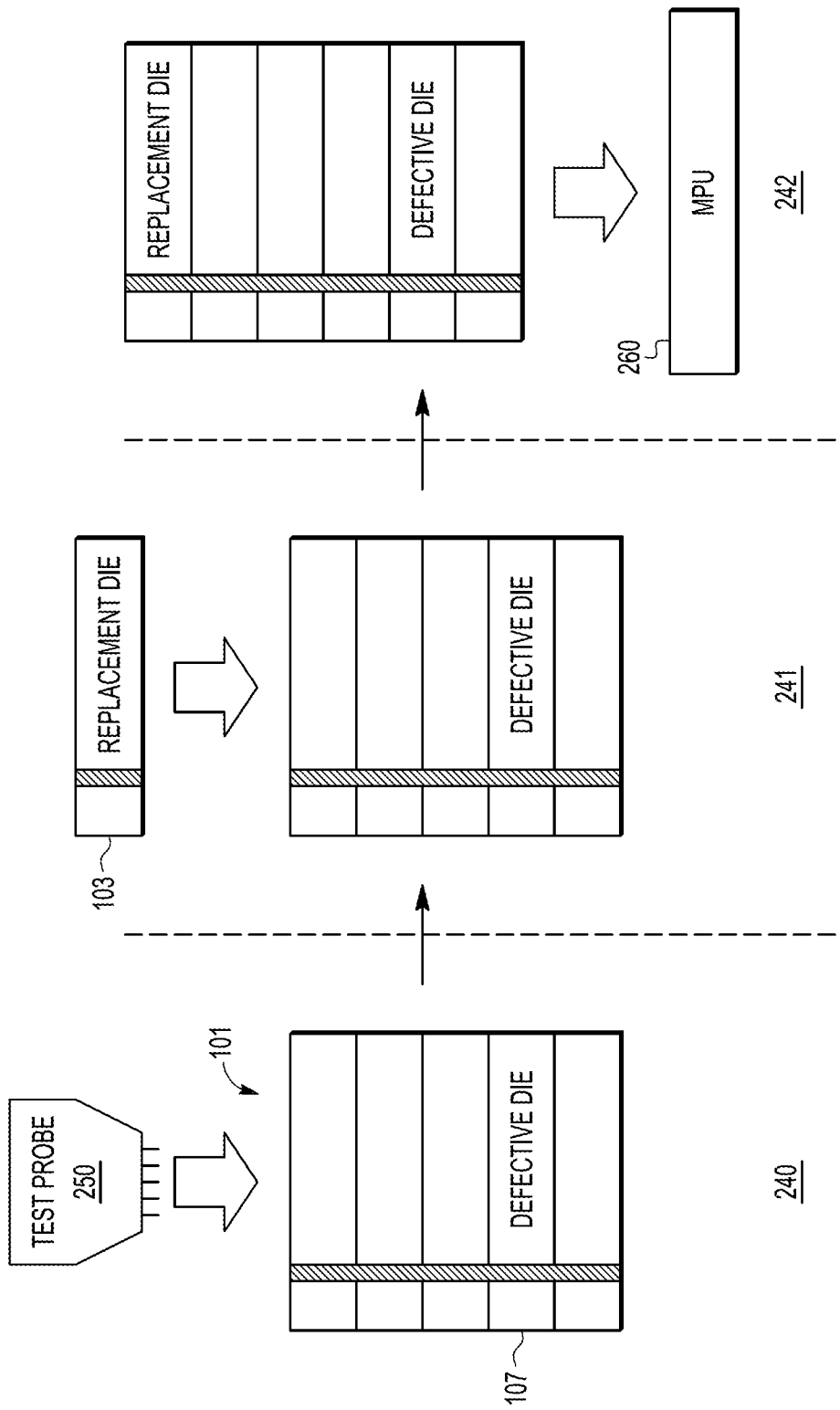
FIG. 2 is a block diagram illustrating replacement of a defective die in a stacked die IC in accordance with at least one embodiment of the present disclosure.

FIG. 2 is a block diagram illustrating replacement of a defective die in the stacked die IC 100 of FIG. 1 in accordance with at least one embodiment of the present disclosure. FIG. 2 illustrates three instances in time, designated times 240, 241, and 242. At or before time 240, a test probe 250 is applied to the dies of the stacked die IC 100. The test probe 250 applies electrical stimuli at one or more contacts of each of the die, and measures the response electrical signaling at other contacts. A tester (not shown at FIG. 2) compares the response signaling to specified expected results, and based on this comparison identifies the die 107 as a defective die. In addition, the tester identifies the defect of the defective die 107 as a non-repairable defect.

In response to identifying the non-repairable defect, the tester determines that there are no replacement dies for the die 107 that are not already in use. Accordingly, at time 241 a manufacturing control module places the replacement die 103 on top of the stack 101. In at least one embodiment, the manufacturing control module affixes the replacement die 103 to the stack 101 using a relatively low-temperature solder process, whereas the existing dies in the stack were bonded together using a higher temperature solder process. This ensures that the bonding of the replacement die 103 to the stack 101 does not damage the bonds between the other dies in the stack. An example of a solder alloy for the low-temperature solder process is 63% tin (Sn)/37% lead (Pb) which has a melting point of approximately 183 C. An example of a solder alloy for the high-temperature solder process is 90% tin (Sn)/10% lead (Pb) which has a melting point of approximately 240 C. Lead free solders can also be used. An example of a lead free solder alloy for the low-temperature solder process is 96.5% tin (Sn)/3% silver (Ag)/0.5% copper (Cu) which melts at 217 C. An example of a lead free solder alloy for the high-temperature solder process is 95% tin (Sn)/5% silver (Ag) which melts at 240 C.

Between time 241 and time 242, the test system replaces the functionality of the defective die 107 with the functionality of the replacement die 103 as described above with respect to FIG. 1. In addition, the stack 101 can be re-tested by the test probe 250 and additional replacement dies added to the stack, until all active dies (e.g. dies having active bits in a set state) have been identified by the testing system as non-defective. At time 242, the die stack 101 is attached to, for example, a multi-core processing unit 260, and subsequently packaged in an integrated circuit package. In other embodiments, the die stack 101 can be bonded to a semiconductor substrate in a flip-chip arrangement, or can be placed on a substrate alongside another die stack in a flip-chip arrangement with a ball-grid array.

Figure 3:
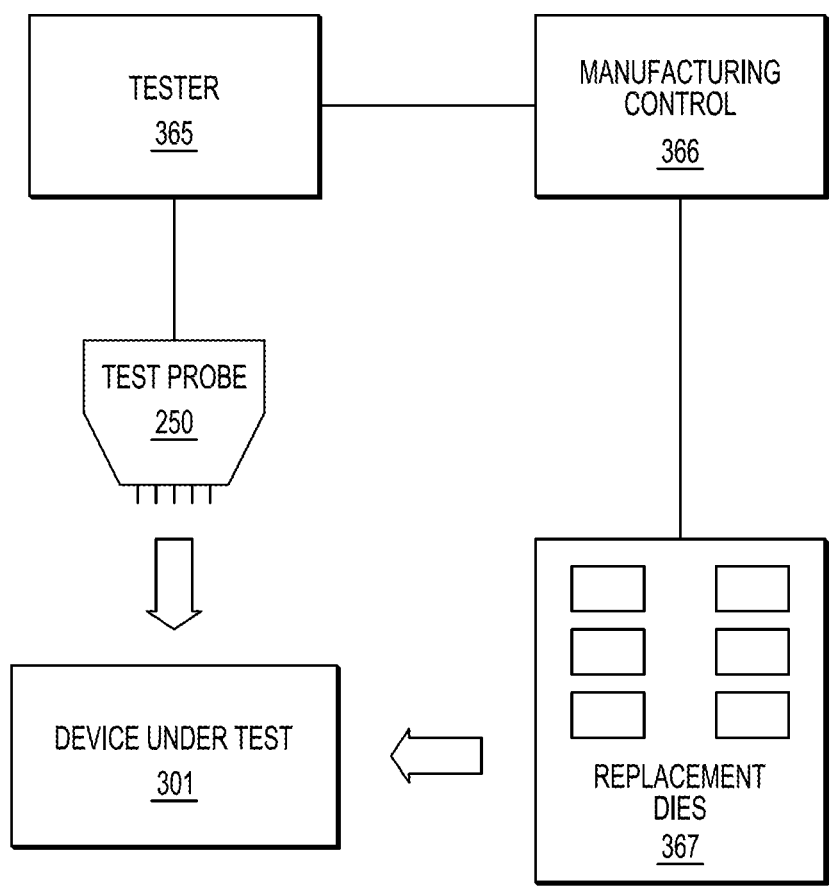
FIG. 3 is a block diagram of a system for replacing a defective die in a stacked die IC in accordance with one embodiment of the present disclosure.

FIG. 3 is a block diagram of a test system 300 that can be used to test the stacked die IC 100 of FIG. 1. In the illustrated example, the test system 300 includes a device under test (DUT) 301, corresponding to the die stack 101 of FIG. 1. The test system further includes the test probe 250 (FIG. 2), a tester 365, a manufacturing control module 366, and replacement dies 367. The tester 365 is a computer system generally configured to control the test probe 250, including placement of the test probe 250 at the DUT 301, application of specified stimuli at the DUT 301 via the test probe 250, reception of electrical signaling measured by the test probe 250, and comparison of the measured electrical signaling to specified expected results. In addition, the tester 365 can, based on the comparison of the electrical signaling to the expected results, identify defects at one or more of the dies at the DUT 301 and classify the identified defects as repairable or non-repairable defects. Further, the tester 365 can apply control signaling, including assertion and negation of signals at the control pin 115 and application of addresses and program inputs at the die bus 111, to effectuate both internal repair of a defective die using a redundant module at the die itself, and replacement of the functionality of a defective die with a replacement die, as described above with respect to FIG. 1.

The manufacturing control module 366 includes equipment to select dies of the replacement dies 367 and to place and attach the selected dies at the DUT 301. Accordingly, the manufacturing control module can include a computer system to receive information indicating a type of replacement die to be selected, inventory control equipment to identify one of the replacement dies 367 of the indicated type, robotic die selection and placement equipment to select the identified die of the replacement dies 367 and to place the selected replacement die on the die stack at the DUT 301, and bonding equipment to bond the placed on the die stack.

Figure 4:
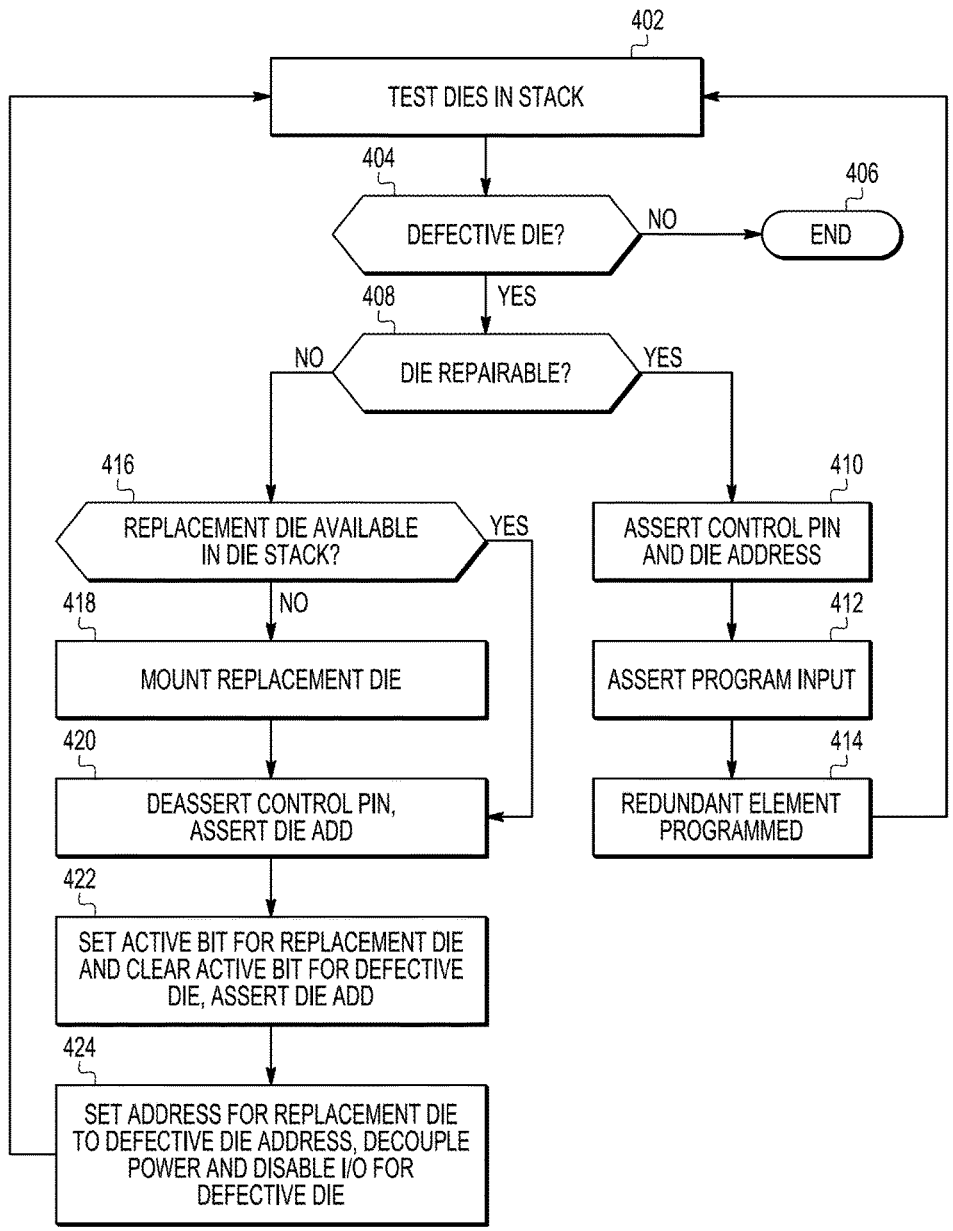
FIG. 4 is a flow diagram of a method for replacing a defective die in a stacked die IC in accordance with one embodiment of the present disclosure.

FIG. 4 illustrates an example method 400 of operation of the testing system 300 is illustrated by the method 400 of FIG. 4 in accordance with one embodiment of the present disclosure. At block 402, the tester 365 applies the test probe 250 to the die stack of the DUT 301. The tester 365 further applies, via the test probe 250, stimuli to one or more contacts of the dies at the die stack and measures electrical signaling responsive to the stimuli at one or more contacts of the dies. At block 404 the tester 365 compares the measured electrical signaling to a specification indicating expected results to identify whether any of the dies in the die stack are defective. If no defective dies are identified, the method flow moves to block 406 and the tester 365 ends the testing of the die stack.

If, at block 404, the tester 365 identifies a defect at one of the dies in the die stack the method flow moves to block 408 and the tester 365 determines whether the type of identified defect is a repairable defect. In at least one embodiment, determination is based on the nature of the defect and the availability of a redundant module at the die to replace the module having the device. If the identified defect is a repairable defect, the method flow moves to block 410 and the tester 365 asserts the control signal at the control pin 115 (FIG. 1) and asserts the die address at the die bus 111. In addition, at block 412, the tester 365 asserts a program input to replace the defective portions of the defective die. At block 414, in response to the program input, the defective die replaces the functionality of the corresponding functional module with equivalent functionality at a redundant module of the defective die. The method flow returns to block 402 so that the tester can retest the dies in the stack.

Returning to block 408, if the tester 365 determines the type of defect is not a repairable defect, the method flow proceeds to block 416 and the tester 365 identifies whether the die stack at the DUT 301 includes a replacement die for the die identified as defective. If so, the method flow proceeds to block 420, described below. If the DUT 301 does not include a replacement die for the defective die, the method flow moves to block 418 and the tester 365 requests a replacement die from the manufacturing control module 366. In response, the manufacturing control module selects an appropriate die from the replacement dies 367, and places and bonds the selected replacement die at the DUT 301.

At block 420, the tester 365 deasserts the signal at the control pin 115 and places the die address for the defective die on the die bus 111. In addition, the tester 365 asserts a program input on the die bus 111 to indicate a die replacement. In response, at block 422 the active bit for the replacement die is set and the active bit for the defective die is negated, thereby activating the replacement die and deactivating the defective die. At block 424 the die address for the defective die is stored at the replacement die, power is decoupled from the defective die, and input/output modules for the defective die are placed in an inactive state (e.g. placed in a tri-state mode). The method flow returns to block 402 where the tester 365 retests the dies in the die stack, including any active replacement dies.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
   detecting a first defect in a first die of a plurality of dies arranged in a stacked die integrated circuit; and
   in response to detecting the first defect, replacing the first die with a second die of the plurality of dies by activating the second die by setting a first bus address for the second die to correspond to a second bus address for the first die and deactivating the first die.

2. The method of claim 1, wherein deactivating the first die comprises negating a first active bit at the first die and activating the second die comprises setting a second active bit at the second die.

3. The method of claim 1, wherein deactivating the first die comprises deactivating the second bus address for the first die.

4. The method of claim 1, wherein deactivating the first die comprises decoupling power from a module of the first die.

5. The method of claim 1, wherein deactivating the first die comprises placing an input/output module of the first die in an inactive state.

6. The method of claim 1, further comprising adding the second die to the plurality of dies in response to identifying the first defect.

7. The method of claim 6, wherein adding the second die comprises adding the second die using a first solder having a melting point at least 15 degrees Celsius different from a melting point of a second solder used to attach the first die at the plurality of dies.

8. A method, comprising:
   detecting a defect at a first die of a plurality of dies arranged in a stacked die integrated circuit;
   in response to the defect being a defect of a first type, replacing functionality of a defective module of the first die with functionality of a second module of the first die; and
   in response to the defect being a defect of a second type at the first die, replacing the functionality of the first die with functionality of a second die of the plurality of dies by setting a first bus address for the second die to correspond to a second bus address for the first die.

9. The method of claim 8, wherein replacing the functionality of the defective module comprises asserting a control pin of the first die to indicate an internal repair of the first die.

10. The method of claim 8, wherein replacing the functionality of the first die with the second die comprises:
    negating a control pin of the first die to indicate a non-internal repair of the first die; and
    negating a first active bit at the first die and activating setting a second active bit at the second die.

11. The method of claim 10, wherein replacing the functionality of the first die with the functionality of the second die further comprises decoupling power from a module of the first die.

12. The method of claim 10, wherein replacing the functionality of the first die with the functionality of the second die further comprises placing an input/output module of the first die in an inactive state.

13. The method of claim 8, wherein replacing the functionality of the first die with the functionality of the second die further comprises clearing the second bus address for the first die.

* * * * *